(12) United States Patent
Moore et al.

(10) Patent No.: US 10,123,464 B2
(45) Date of Patent: Nov. 6, 2018

(54) HEAT DISSIPATING SYSTEM

(75) Inventors: David A Moore, Tomball, TX (US);
John P Franz, Houston, TX (US);
Tahir Cader, Liberty Lake, WA (US);
Michael L Sabotta, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 14/376,124

(22) PCT Filed: Feb. 9, 2012

(86) PCT No.: PCT/US2012/024564
§ 371 (c)(1),
(2), (4) Date: Jul. 31, 2014

(87) PCT Pub. No.: WO2013/119243
PCT Pub. Date: Aug. 15, 2013

(65) Prior Publication Data
US 2014/0376178 A1    Dec. 25, 2014

(51) Int. Cl.
*H05K 7/20* (2006.01)
*G06F 1/20* (2006.01)
*H02G 5/10* (2006.01)

(52) U.S. Cl.
CPC ........... *H05K 7/20781* (2013.01); *G06F 1/20* (2013.01); *H02G 5/10* (2013.01); *H05K 7/2079* (2013.01);
(Continued)

(58) Field of Classification Search
CPC ............. H05K 7/20781; H05K 7/2079; H05K 7/20818; H05K 7/20827; H02G 5/10; G06F 1/20; G06F 2200/201
(Continued)

(56) References Cited

U.S. PATENT DOCUMENTS

| 211,501 A | 1/1879 | Doane |
| 2,582,553 A | 1/1952 | McMurtie |

(Continued)

FOREIGN PATENT DOCUMENTS

| CN | 2519983 Y | 11/2002 |
| CN | 1653612 | 8/2005 |

(Continued)

OTHER PUBLICATIONS

Anis Dehbi, "Efficient Electrothermal Simulation of Power Electronics for Hybrid Electric Vehicle," pp. 1-7, Apr. 20-23, 2008 http://www.technet-alliance.com/uploads/tx_caeworld/paper_eurosime32_killat_rudnyi.pdf.

(Continued)

*Primary Examiner* — Dimary Lopez Cruz
*Assistant Examiner* — Zhengfu Feng
(74) *Attorney, Agent, or Firm* — Hewlett Packard Enterprise Patent Department

(57) ABSTRACT

Heat dissipating system and method are disclosed. An example method includes removing heat from a rack component via a thermal transport. The method also includes applying a pressure at a fluid cooled thermal bus bar on a rack system to form a thermally conductive dry disconnect interface and form a heat path between the thermal transport and the fluid cooled thermal bus bar.

17 Claims, 11 Drawing Sheets

(52) U.S. Cl.
CPC ..... *H05K 7/20818* (2013.01); *H05K 7/20827* (2013.01); *G06F 2200/201* (2013.01)

(58) Field of Classification Search
USPC ...... 361/676–678, 679.46–679.54, 688–723, 361/752, 760, 762, 831; 174/252, 520, 174/526; 165/104.26, 104.28, 104.33, 165/185
See application file for complete search history.

(56) References Cited

U.S. PATENT DOCUMENTS

| | | | |
|---|---|---|---|
| 3,279,875 A | 10/1966 | St. Cyr | |
| 3,807,572 A | 4/1974 | Luvara | |
| 4,453,785 A | 6/1984 | Smith | |
| 4,714,107 A | 12/1987 | Adsett | |
| 4,716,722 A | 1/1988 | Rambach | |
| 5,228,385 A | 7/1993 | Friedrich | |
| 5,370,178 A * | 12/1994 | Agonafer | H01L 23/467 165/137 |
| 5,417,012 A | 5/1995 | Brightman et al. | |
| 5,505,533 A | 4/1996 | Kammersqard | |
| 5,514,906 A | 5/1996 | Love | |
| 5,829,514 A | 11/1998 | Smith et al. | |
| 5,867,369 A | 2/1999 | Antonuccio | |
| 5,918,469 A | 7/1999 | Cardella | |
| 5,964,092 A | 10/1999 | Tozuka et al. | |
| 5,971,166 A | 10/1999 | Ong | |
| 5,982,616 A | 11/1999 | Moore | |
| 5,986,882 A | 11/1999 | Ekrot et al. | |
| 6,084,769 A | 7/2000 | Moore et al. | |
| 6,111,749 A | 8/2000 | Lamb et al. | |
| 6,234,842 B1 | 5/2001 | Keay et al. | |
| 6,305,180 B1 | 10/2001 | Miller et al. | |
| 6,333,849 B1 | 12/2001 | Donahoe | |
| 6,377,453 B1 | 4/2002 | Belady | |
| 6,594,148 B1 | 7/2003 | Nguyen | |
| 6,600,649 B1 | 7/2003 | Tsai et al. | |
| 6,796,372 B2 | 9/2004 | Baer | |
| 6,879,486 B1 | 4/2005 | Banton | |
| 6,987,673 B1 | 1/2006 | French | |
| 7,051,802 B2 | 5/2006 | Baer | |
| 7,057,893 B2 | 6/2006 | Nicolai et al. | |
| 7,106,590 B2 | 9/2006 | Chu et al. | |
| 7,133,283 B2 | 11/2006 | Faneuf et al. | |
| 7,298,619 B1 | 11/2007 | Malone et al. | |
| 7,318,322 B2 | 1/2008 | Ota et al. | |
| 7,393,236 B2 | 7/2008 | Thompson et al. | |
| 7,397,661 B2 | 7/2008 | Campbell et al. | |
| 7,403,384 B2 | 7/2008 | Pflueger | |
| 7,403,392 B2 | 7/2008 | Attlesey | |
| 7,450,378 B2 | 11/2008 | Nelson et al. | |
| 7,539,020 B2 | 5/2009 | Chow et al. | |
| 7,564,685 B2 | 7/2009 | Clidatas et al. | |
| 7,647,787 B2 | 1/2010 | Belady et al. | |
| 7,715,194 B2 | 5/2010 | Brewer et al. | |
| 7,718,891 B2 | 5/2010 | Adducci | |
| 7,724,524 B1 | 5/2010 | Campbell | |
| 7,764,494 B2 | 7/2010 | Balzano | |
| 7,800,900 B1 | 9/2010 | Noteboom et al. | |
| 7,907,402 B2 | 3/2011 | Caveney | |
| 7,907,409 B2 | 3/2011 | Wyatt et al. | |
| 7,916,480 B2 | 3/2011 | Woody et al. | |
| 7,916,483 B2 | 3/2011 | Campbell et al. | |
| 7,957,132 B2 | 6/2011 | Fried | |
| 7,961,475 B2 | 6/2011 | Campbell | |
| 7,971,632 B2 | 7/2011 | Eriksen | |
| 8,004,832 B2 | 8/2011 | Brunschwiller et al. | |
| 8,014,150 B2 | 9/2011 | Campbell et al. | |
| 8,027,162 B2 | 9/2011 | Campbell et al. | |
| 8,050,036 B2 | 11/2011 | Suzuki et al. | |
| 8,079,481 B2 | 12/2011 | Canfield et al. | |
| 8,089,766 B2 | 1/2012 | Attlesey | |
| 8,164,901 B2 | 4/2012 | Neudorfer | |
| 8,194,406 B2 | 6/2012 | Campbell | |
| 8,327,656 B2 | 12/2012 | Tutunoglu | |
| 8,351,206 B2 | 1/2013 | Campbell | |
| 8,369,090 B2 | 2/2013 | Chester | |
| 8,498,113 B2 † | 7/2013 | Tran | |
| 8,755,192 B1 * | 6/2014 | Schrempp | G06F 1/20 361/679.5 |
| 8,844,732 B2 | 9/2014 | Wu et al. | |
| 9,803,937 B2 | 10/2017 | Franz et al. | |
| 9,927,187 B2 | 3/2018 | Moore et al. | |
| 2002/0021557 A1 | 2/2002 | Ishimine et al. | |
| 2002/0163782 A1 | 11/2002 | Cole | |
| 2003/0128516 A1 | 7/2003 | Faneuf et al. | |
| 2003/0231467 A1 | 12/2003 | Replogle | |
| 2004/0069455 A1 * | 4/2004 | Lindemuth | B22F 7/004 165/104.15 |
| 2004/0070949 A1 | 4/2004 | Oikawa et al. | |
| 2004/0201335 A1 | 10/2004 | Davis | |
| 2004/0221604 A1 | 11/2004 | Ota | |
| 2005/0128705 A1 | 6/2005 | Chu et al. | |
| 2005/0168945 A1 | 8/2005 | Coglitore | |
| 2005/0199372 A1 | 9/2005 | Frazer et al. | |
| 2005/0265004 A1 | 12/2005 | Coglitore | |
| 2005/0270751 A1 | 12/2005 | Coglitore | |
| 2005/0280986 A1 | 12/2005 | Coglitore | |
| 2005/0286235 A1 | 12/2005 | Randall et al. | |
| 2006/0012955 A1 | 1/2006 | Vinson et al. | |
| 2006/0012959 A1 | 1/2006 | Lee | |
| 2006/0065874 A1 | 3/2006 | Campbell | |
| 2006/0126296 A1 | 6/2006 | Campbell et al. | |
| 2006/0152238 A1 | 7/2006 | Beaman | |
| 2006/0176664 A1 | 8/2006 | Casebolt | |
| 2006/0176665 A1 | 8/2006 | Matsushima | |
| 2006/0232945 A1 | 10/2006 | Chu et al. | |
| 2006/0278372 A1 | 12/2006 | Lai et al. | |
| 2007/0006992 A1 | 1/2007 | Liu et al. | |
| 2007/0034354 A1 | 2/2007 | Tung et al. | |
| 2007/0091579 A1 | 4/2007 | Larson et al. | |
| 2007/0119569 A1 | 5/2007 | Campbell et al. | |
| 2007/0163749 A1 | 7/2007 | Miyahara | |
| 2007/0188996 A1 | 8/2007 | Liang | |
| 2007/0235180 A1 | 10/2007 | Ouyang et al. | |
| 2007/0258211 A1 | 11/2007 | Sonobe | |
| 2007/0259616 A1 | 11/2007 | Scattolin | |
| 2007/0274043 A1 | 11/2007 | Shabany | |
| 2007/0289718 A1 | 12/2007 | McCordic et al. | |
| 2007/0291452 A1 | 12/2007 | Gilliland et al. | |
| 2007/0297136 A1 * | 12/2007 | Konshak | H05K 7/20772 361/699 |
| 2008/0024977 A1 | 1/2008 | Coglitore | |
| 2008/0055846 A1 | 3/2008 | Clidaras | |
| 2008/0232064 A1 | 9/2008 | Sato et al. | |
| 2008/0239649 A1 | 10/2008 | Bradicich et al. | |
| 2008/0245083 A1 | 10/2008 | Tutunoglu | |
| 2008/0271878 A1 | 11/2008 | Harvey et al. | |
| 2009/0021907 A1 | 1/2009 | Mann | |
| 2009/0052136 A1 | 2/2009 | Chung | |
| 2009/0065178 A1 | 3/2009 | Kasezawa et al. | |
| 2009/0086426 A1 | 4/2009 | Brandon | |
| 2009/0129011 A1 | 5/2009 | Balzano | |
| 2009/0225514 A1 | 9/2009 | Correa et al. | |
| 2009/0260777 A1 | 10/2009 | Attlesey | |
| 2009/0262495 A1 * | 10/2009 | Neudorfer | G06F 1/20 361/679.47 |
| 2009/0266515 A1 | 10/2009 | Oikawa | |
| 2010/0003911 A1 | 1/2010 | Graczyk | |
| 2010/0032142 A1 | 2/2010 | Copeland et al. | |
| 2010/0033931 A1 | 2/2010 | Miyazawa | |
| 2010/0051235 A1 | 3/2010 | Mori et al. | |
| 2010/0103614 A1 | 4/2010 | Campbell | |
| 2010/0103618 A1 | 4/2010 | Campbell | |
| 2010/0110621 A1 | 5/2010 | Dunn et al. | |
| 2010/0141379 A1 | 6/2010 | Tucker | |
| 2010/0149754 A1 | 6/2010 | Chapel et al. | |
| 2010/0165565 A1 | 7/2010 | Hellriegal | |
| 2010/0175866 A1 | 7/2010 | Tani et al. | |
| 2010/0226094 A1 | 9/2010 | Attlesey | |
| 2010/0236772 A1 | 9/2010 | Novotny et al. | |
| 2010/0248609 A1 | 9/2010 | Tresh | |
| 2010/0263830 A1 | 10/2010 | Noteboom | |

(56) References Cited

U.S. PATENT DOCUMENTS

| | | |
|---|---|---|
| 2010/0290190 A1 | 11/2010 | Chester et al. |
| 2010/0319883 A1 | 12/2010 | Facusse |
| 2010/0326628 A1 | 12/2010 | Campbell et al. |
| 2011/0045759 A1 | 2/2011 | Rasmussen et al. |
| 2011/0056674 A1 | 3/2011 | Campbell et al. |
| 2011/0056675 A1 | 3/2011 | Barringer et al. |
| 2011/0060470 A1 | 3/2011 | Campbell et al. |
| 2011/0073726 A1 | 3/2011 | Bergesch |
| 2011/0079376 A1 | 4/2011 | Loong et al. |
| 2011/0192568 A1 | 8/2011 | Hsieh |
| 2011/0240281 A1 | 10/2011 | Avery |
| 2011/0242760 A1 | 10/2011 | Bott et al. |
| 2011/0303394 A1 | 12/2011 | Branton |
| 2011/0315353 A1 | 12/2011 | Campbell |
| 2011/0315367 A1 | 12/2011 | Romero et al. |
| 2012/0019115 A1* | 1/2012 | Dunwoody .......... H05K 7/1488 312/236 |
| 2012/0050984 A1 | 3/2012 | Peng et al. |
| 2012/0069514 A1 | 3/2012 | Ross |
| 2012/0116590 A1 | 5/2012 | Florez-Larrahondo et al. |
| 2012/0127655 A1 | 5/2012 | Tung et al. |
| 2012/0138285 A1 | 6/2012 | Tsubaki et al. |
| 2012/0273185 A1 | 11/2012 | Arimilli et al. |
| 2012/0325126 A1* | 12/2012 | Tran .................. H03M 13/1102 109/29 |
| 2013/0077232 A1 | 3/2013 | Nordin |
| 2013/0081792 A1 | 4/2013 | Tufty |
| 2013/0141863 A1 | 6/2013 | Ross et al. |
| 2013/0163185 A1 | 6/2013 | Gilges et al. |
| 2013/0308267 A1* | 11/2013 | Wu .......................... G06F 1/20 361/679.53 |
| 2014/0033753 A1 | 2/2014 | Lu |
| 2014/0038510 A1 | 2/2014 | Bailey |
| 2014/0049146 A1 | 2/2014 | Kamaludeen |
| 2014/0049914 A1 | 2/2014 | Campbell |
| 2014/0085821 A1 | 3/2014 | Regimbal et al. |
| 2015/0003009 A1 | 1/2015 | Moore |
| 2016/0066478 A1 | 3/2016 | Van Den Bergen |

FOREIGN PATENT DOCUMENTS

| | | |
|---|---|---|
| CN | 1956101 A | 5/2007 |
| CN | 101132688 | 2/2008 |
| CN | 100455175 | 1/2009 |
| CN | 101398706 A | 4/2009 |
| CN | 101509732 A | 8/2009 |
| CN | 101568248 A | 10/2009 |
| CN | 1581366 | 5/2010 |
| CN | 101111734 B | 5/2010 |
| CN | 101893921 | 11/2010 |
| CN | 201654658 U | 11/2010 |
| CN | 201020130382.7 | 11/2010 |
| CN | 102014598 A | 4/2011 |
| CN | 102089727 | 6/2011 |
| CN | 102159051 A | 8/2011 |
| CN | 102159058 A | 8/2011 |
| CN | 102189311 | 9/2011 |
| EP | 1860695 | 11/2007 |
| EP | 1481467 B1 | 6/2010 |
| EP | 2490303 A1 | 8/2012 |
| JP | S6391376 U | 4/1988 |
| JP | H02300890 A | 12/1990 |
| JP | 11220281 | 8/1999 |
| JP | 2000059062 | 2/2000 |
| JP | 2000076537 A | 3/2000 |
| JP | 200016662 A | 6/2000 |
| JP | 2001168256 A | 6/2001 |
| JP | 2004295718 A | 10/2004 |
| JP | 2005228216 | 8/2005 |
| JP | 2007123547 A | 5/2007 |
| JP | 2008509542 A | 3/2008 |
| JP | 2010004736 | 1/2010 |
| JP | 2011108891 A | 6/2011 |
| JP | 2012248576 A | 12/2012 |
| JP | 2013506996 A | 2/2013 |
| KR | 1020090102804 A | 9/2009 |
| KR | 100944890 | 3/2010 |
| KR | 20110004857 | 1/2011 |
| KR | 1020110004857 A | 1/2011 |
| KR | 101103394 | 1/2012 |
| KR | 1020100019308 A | 2/2018 |
| TW | M254049 | 12/2004 |
| TW | M312877 | 5/2007 |
| TW | M421677 A | 1/2012 |
| TW | 201221034 A | 5/2012 |
| TW | 201228570 A | 7/2012 |
| TW | 201249322 A | 12/2012 |
| WO | WO-0242703 A2 | 5/2002 |
| WO | WO-03107523 A1 | 12/2003 |
| WO | WO-2010062553 | 6/2010 |
| WO | WO-2011073668 | 6/2011 |
| WO | WO-2011092333 | 8/2011 |
| WO | WO-2011133166 | 10/2011 |
| WO | WO-2012024564 A1 | 2/2012 |
| WO | WO-PCT/US2012/024564 | 2/2012 |
| WO | WO-2012028718 A1 | 3/2012 |
| WO | WO-PCT/US2012/028718 | 3/2012 |
| WO | WO-PCT/US2012/028744 | 3/2012 |
| WO | WO-2012057739 A1 | 5/2012 |
| WO | WO-PCT/US2012/057739 | 9/2012 |
| WO | WO-PCT/US2012/062874 | 10/2012 |
| WO | WO-PCT/US2013/024037 | 1/2013 |
| WO | WO-2012157247 A1 | 7/2014 |

OTHER PUBLICATIONS

EPO; European Extended Search Report dated Oct. 12, 2015, EP12871455.7, 12 pps.
EPO, Extended European Search Report, dated Feb. 12, 2016, EP App No. 12871555.4 , 11 pps.
EPO, Extended European Search Report, dated May 3, 2016, EP App. No. 12885470.0.
http://www.technet-alliance.com/uploads/tx_caeworld/paper_eurosime32_killat_rudnyi.pdf > On pp. 1-7, Efficient Electrothermal Simulation of Power Electronics for Hybrid Electric Vehicle, Dehbi, A. et al., Apr. 20-23, 2008.
PCT/ISA/KR, International Search Report dated Nov. 12, 2012, PCT/US2012/028744, 9 pps.
PCT/ISA/KR, International Search Report dated Oct. 12, 2012, PCT/US2012/024564, 10 pps.
PCT/ISA/KR, International Search Report, dated Nov. 14, 2012, PCT/US2012/028718, 9 pps.
PCT/ISA/KR, International Search Report, dated Nov. 20, 2013, PCT/US2012/062874, 11 pps.
PCT/ISA/KR, International Search Report, dated Oct. 25, 2013, PCT/US2013/024037, 17 pps.
Extended European Search Report dated Aug. 9, 2016, Application Number: 12867753.1, pp. 8.
Moore, David A., et al.; "Non-Final Office Action cited in U.S. Appl. No. 14/376,137" dated Oct. 13, 2017; 31 pages.
Alcatel-Lucent, "Alcatel-lucent Modular Cooling Solution," Technology White Paper, 2010, pp. 1-14.
Anis Dehbi et al., "Efficient Electrothermal Simulation of Power Electronics for Hybrid Electric Vehicle," Apr. 2008, pp. 1-7, IEEE.
Extended European Search Report, EP Application No. 12887787, dated May 5, 2016, pp. 1-8, EPO.
Extended European Search Report, EP Application No. 13873193, dated Aug. 24, 2016, pp. 1-8, EPO.
Office Action, EP Application No. 13873193, dated May 19, 2017, pp. 1-9, EPO.
Wisegeek, "What Is a Relay Rack?," 2012, pp. 1-4 (online), Conjecture Corporation, Retrieved from the Internet on Aug. 6, 2012 at URL:<wisegeek.com/what-is-a-relay-rack.htm>.

\* cited by examiner
† cited by third party

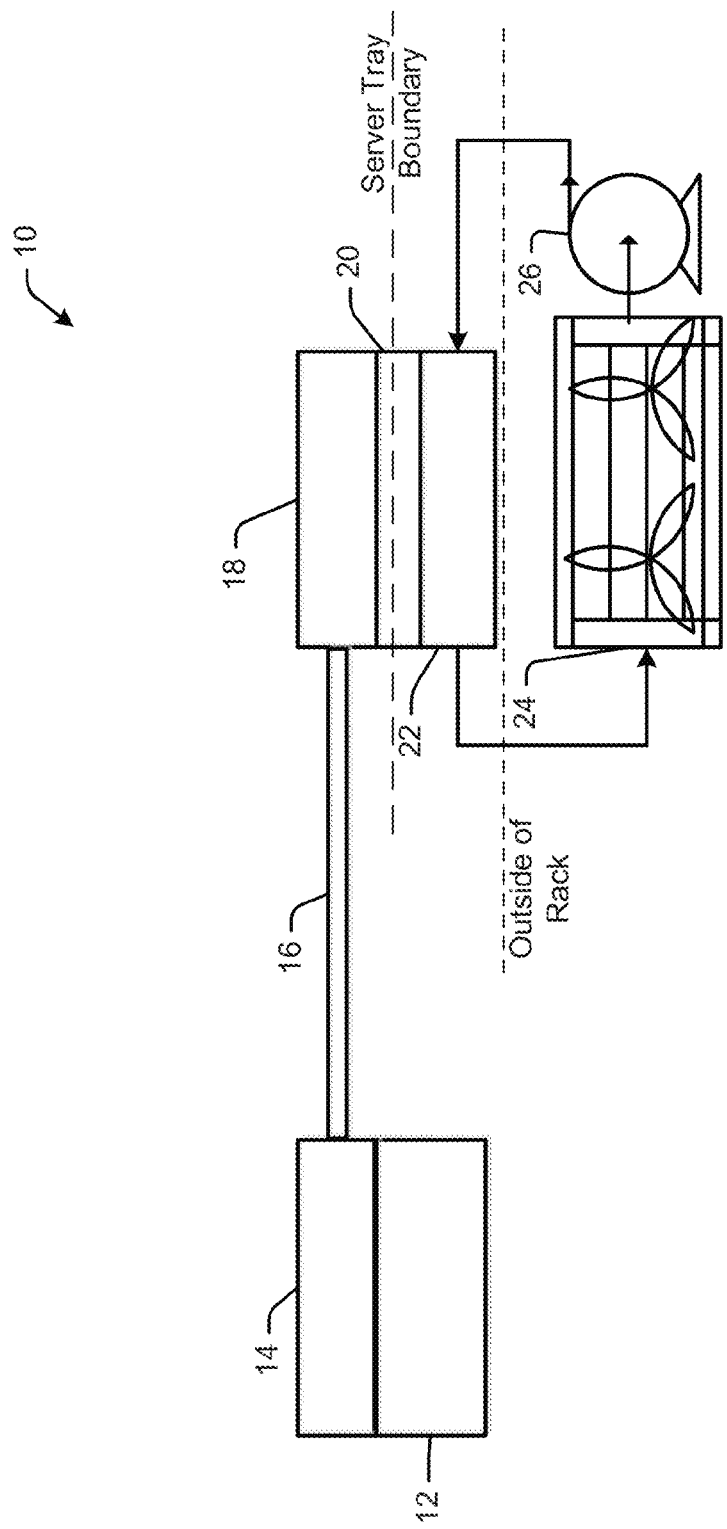

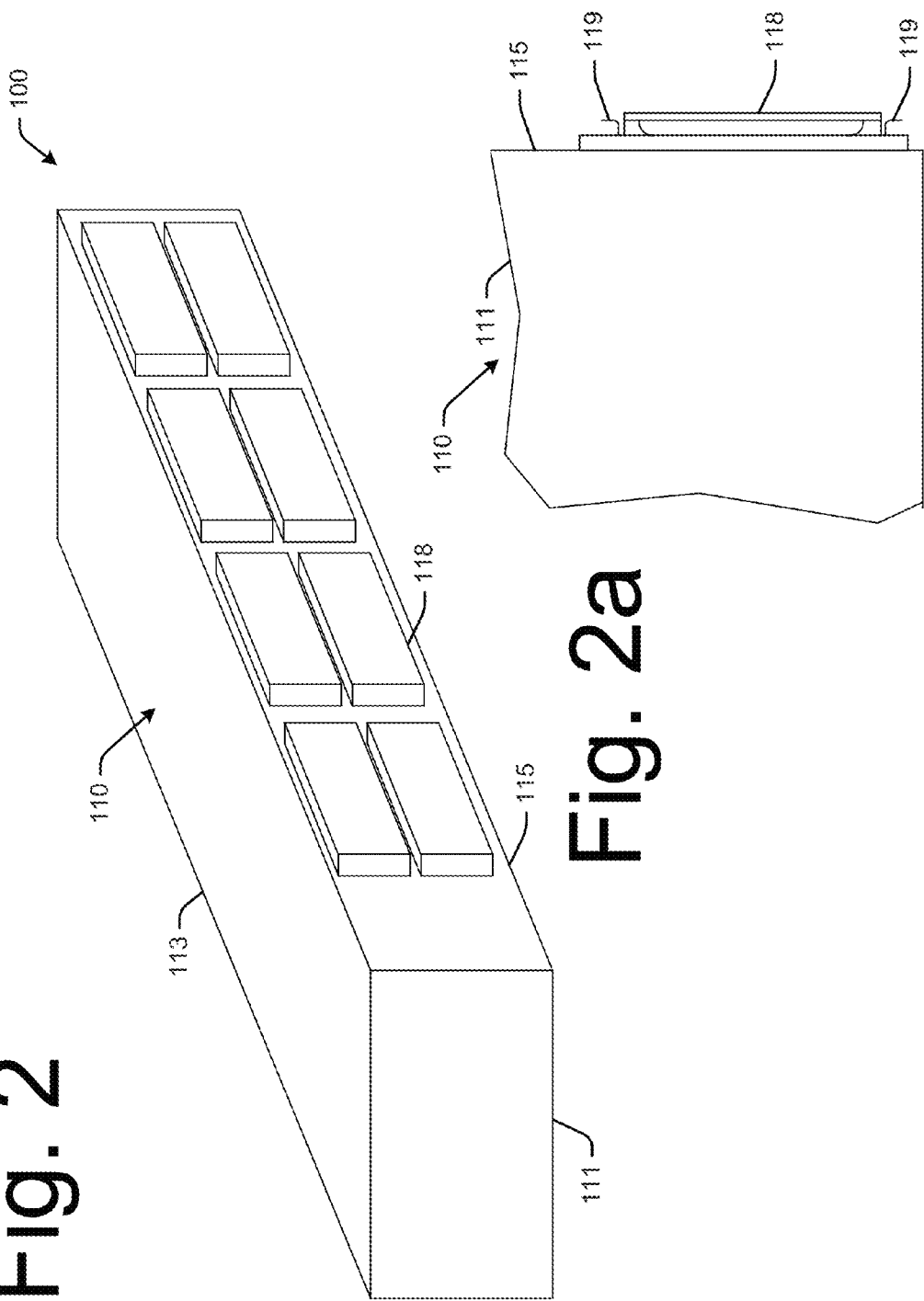

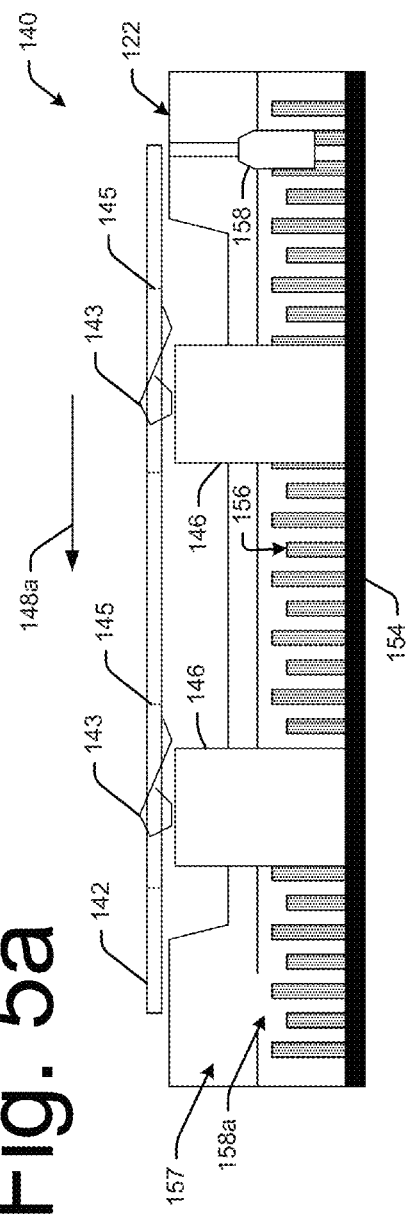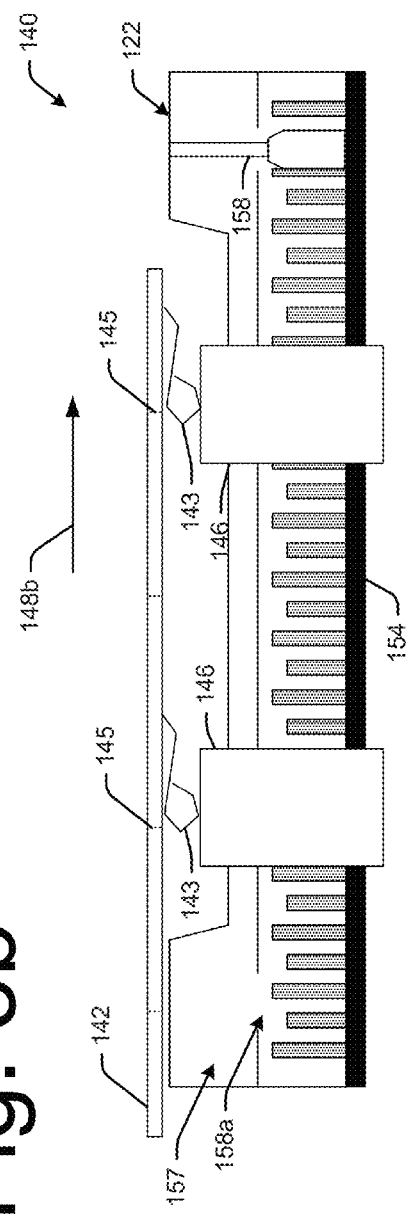

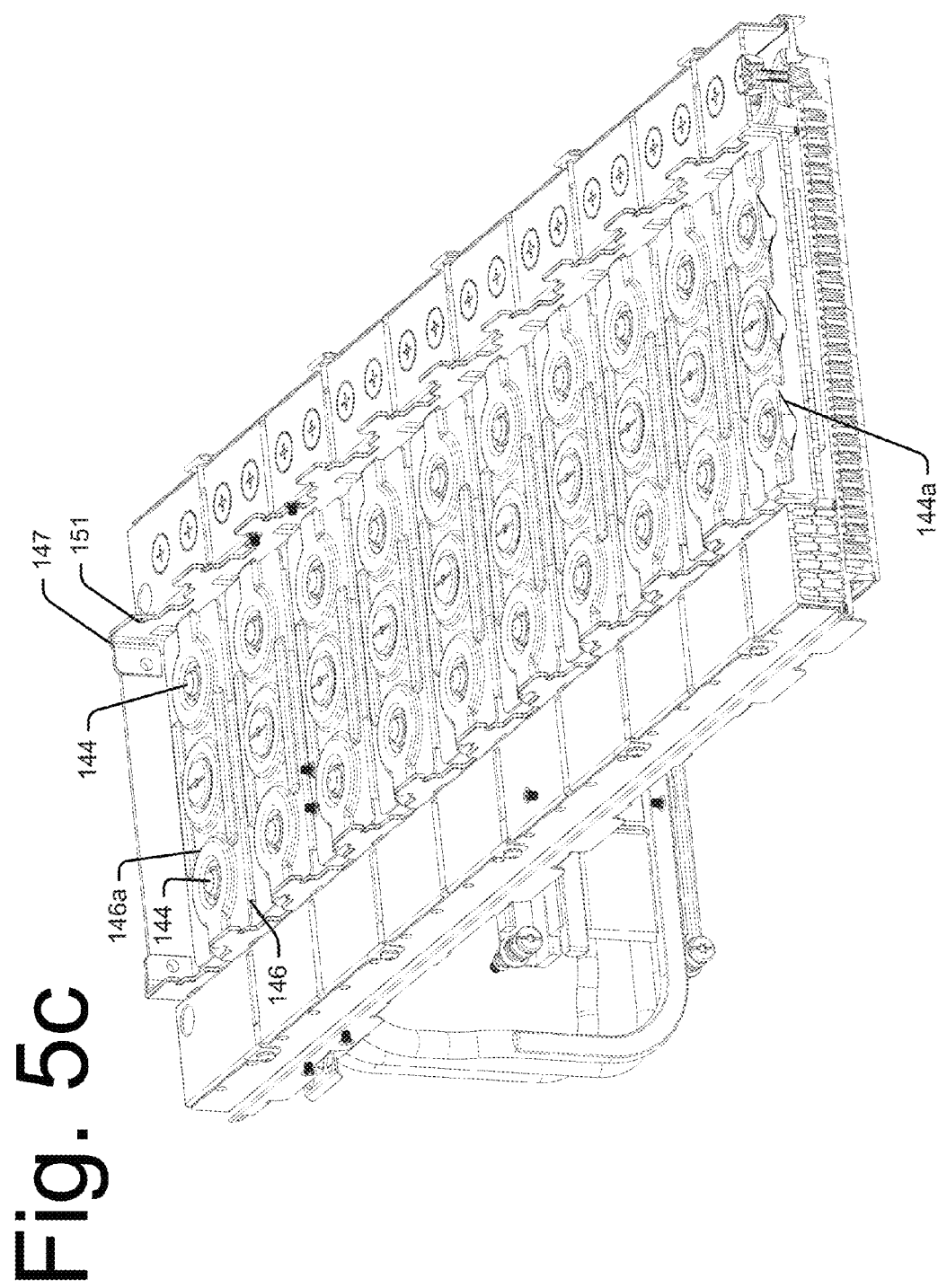

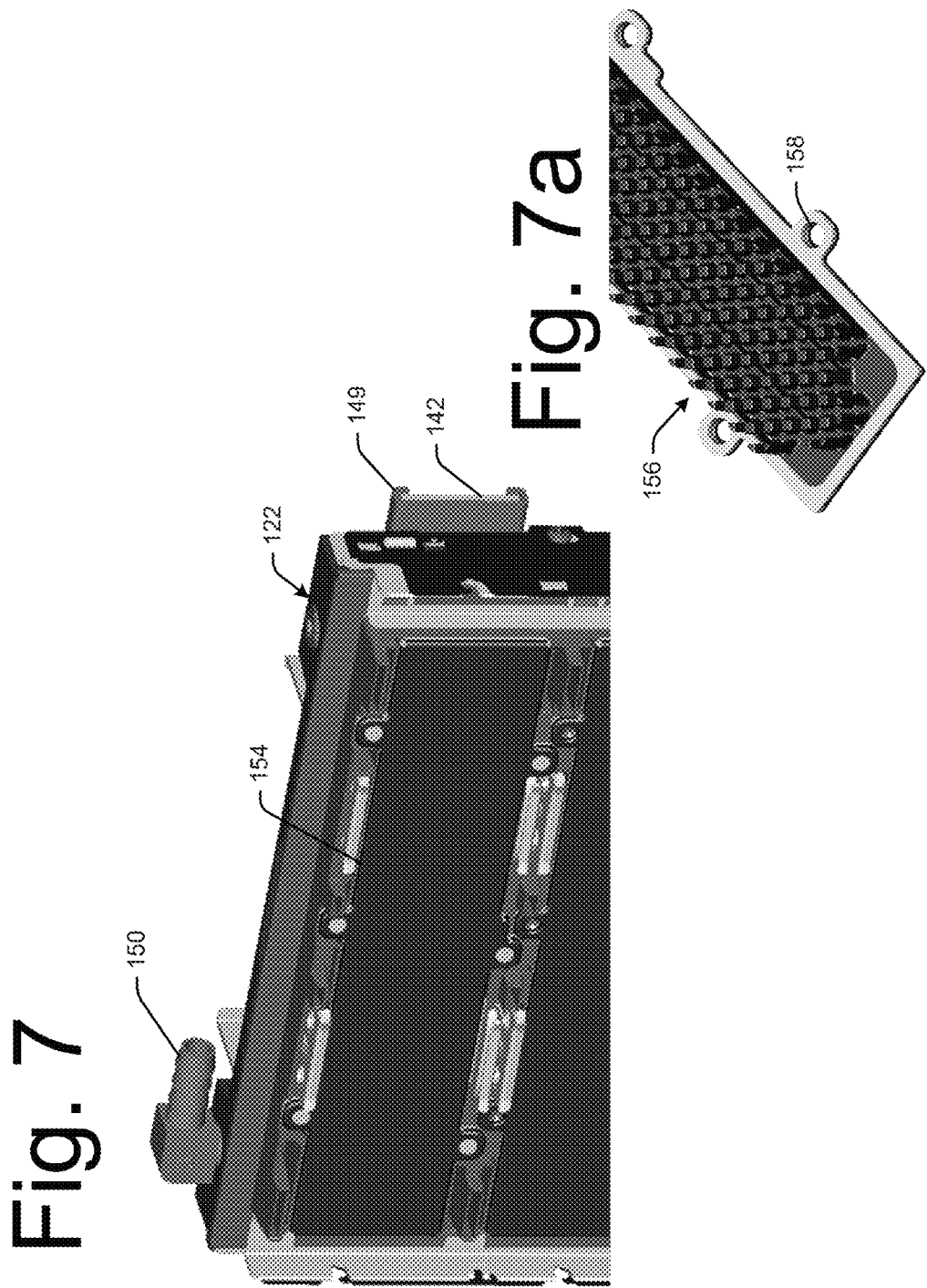

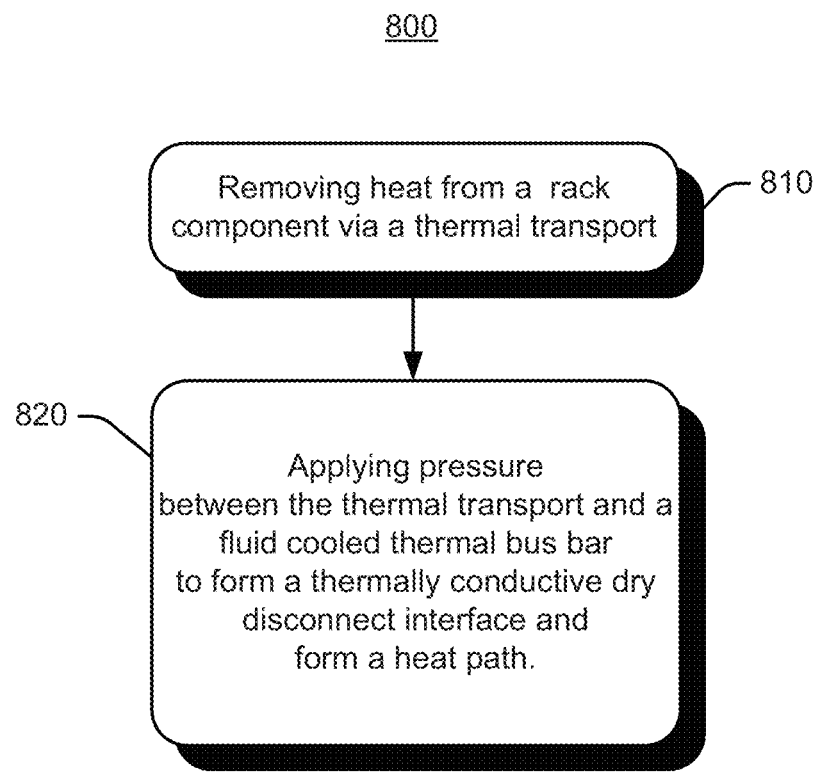

HEAT DISSIPATING SYSTEM

BACKGROUND

Various thermal management systems are available for heat generating devices, such as computer systems and electronics. A simple thermal management system includes a heat sink and a cooling fan. The heat sink is positioned in contact with the electronic components generating heat to transfer this heat into the surrounding air. A cooling fan may be positioned to blow air across the heat sink to dissipate heat into the surrounding environment.

While cooling fans can often be effectively implemented in stand-alone devices, large data centers often locate many heat-generating devices in closely packed arrangements. In such environments, "heat shadowing" remains an issue. Heat shadowing is caused by carryover heat from adjacent or "upstream" devices. For example, a fan that blows heat away from one device may transport that heat across other devices, negatively impacting the operation of those devices.

In addition, fans alone may not provide sufficient cooling for the high power dissipation of devices in large data centers, and fan noise and power consumption are problematic. It is noted that temperature rises if heat is not removed as fast as the heat is produced. Most of the electrical power supplied to computing devices is turned to heat during their operation.

Air conditioning systems, such as chillers, often consume large amounts of electrical power to operate. The inefficiencies of the air conditioning systems reduce overall efficiency of the data center.

BRIEF DESCRIPTION OF THE DRAWINGS

FIG. 1a is a high level block diagram of an example heat dissipating system.

FIG. 2 is a perspective view of an example heat dissipating system as it may be implemented on a rack server.

FIG. 2a is a close up view of a primary heat exchange on the rack server shown in FIG. 2.

FIG. 5a is an illustrated cutaway view of the thermal bus bar showing the clamp mechanism in a locked state.

FIG. 5b is an illustrated cutaway view of the thermal bus bar showing the clamp mechanism in an unlocked state.

FIG. 5c is a cutaway view of an example clamp mechanism.

FIG. 7 is a partial view of one of the thermal bus bars shown in FIG. 6.

FIG. 7a is a partial perspective view of the thermal bus bar in FIG. 7 showing an example pin fin array.

FIG. 8 is a flowchart illustrating example operations 800 of a heat dissipating method.

DETAILED DESCRIPTION

Figure 1B:
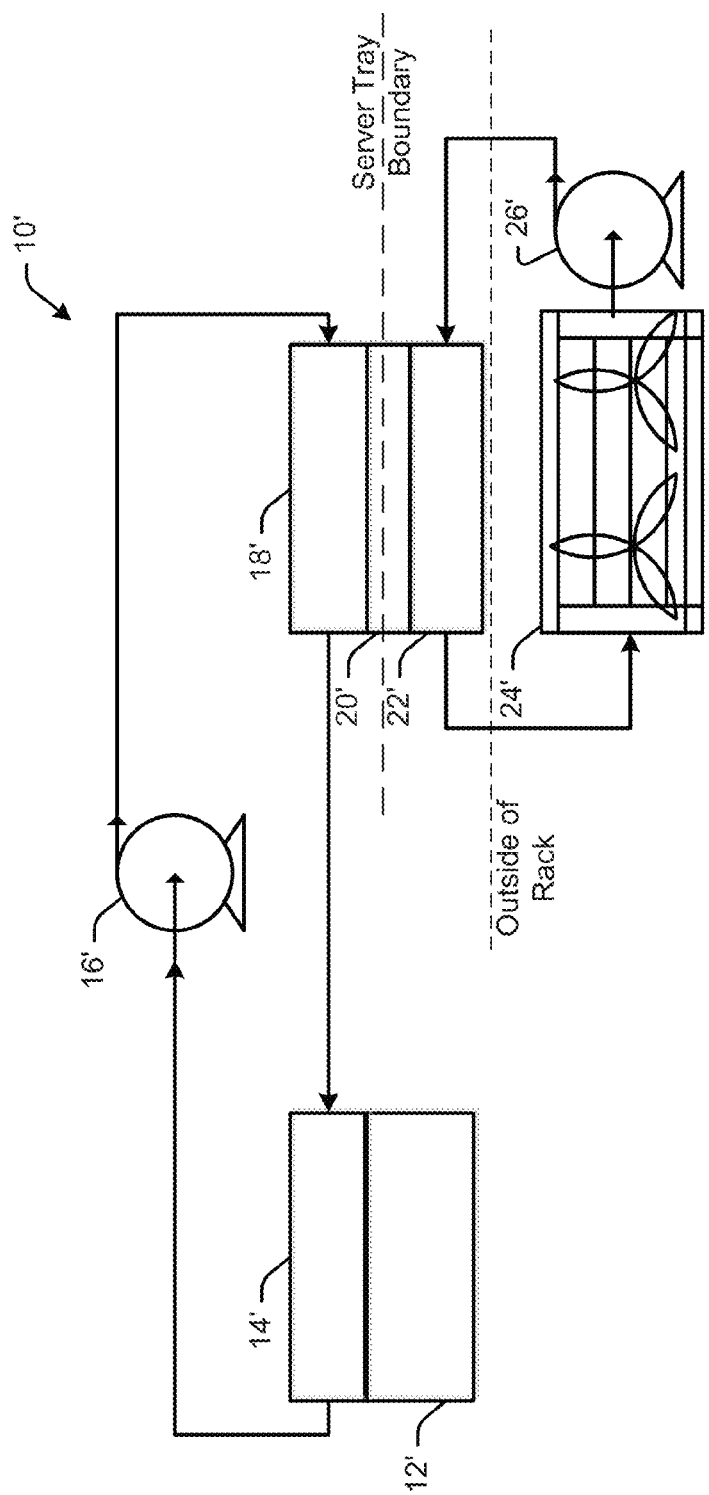
FIG. 1b is a high level block diagram illustrating operation of another example heat dissipating system.

Rack mounted electronic equipment (e.g., computing, networking, and storage devices) can generate large quantities of heat by the very nature of their operation. This heat needs to be dissipated to help prevent damage to the electronic equipment, and enhance operation and lifetime of the electronic equipment. Data centers have traditionally utilized front-to-rear air convection cooling for cooling rack mounted electronic equipment. But equipment density has increased to the point that heat shadowing renders these cooling systems impractical in many environments. Energy efficiency and operating expense considerations also call air cooling into question.

By way of illustration, in order to satisfy device temperature requirements using forced air cooling, large volumes of heat need to be handled by heat sinks and fans. Heat sinks and fans are significant impediments to system board and processor layout. As an example, the volume of space for an air cooled GPU heat sink is approximately 25 mm×100 mm×200 mm for a 225 W configuration and about 80 mm×80 mm×30 mm for a 120 W configuration. The size may correspond at least to some extent on ambient temperatures, air flow, and the neighboring components. In addition to the footprint for the heat sink itself, a fan is needed to bring cool air to the heat sink fins.

Difficulties cooling electronic equipment are compounded, for example, in rack system configurations where multiple GPUs are closely spaced on the system board along the air flow path. For example, the warm air exiting one heat sink feeds directly into the second and third heat sinks, resulting in significantly reduced cooling capacity for those heat sinks.

Rapid increases in equipment power density have also strained the viability of operating models using air cooled racks and Computer Room Air Handlers (CRAHs) supported by chiller-based air conditioning. These systems suffer from poor efficiency and high energy costs.

Proposed legislation has increased pressure on customers to reduce their carbon footprint. These customers view liquid-cooling as an acceptable way to reduce energy consumption by increasing the ability to use so-called "free-cooling" (direct induction of cool outside air used for air cooling, or the use of low temperature water from natural sources such as lakes and rivers). Liquid-cooing also facilitates re-using "waste" heat generated by the data center in other applications. For example, the waste heat may be used to heat nearby buildings during cooler seasons. Projects have also been implemented to reuse waste heat for industrial processes in the United States.

While liquid cooling is more efficient than chiller-based air conditioning, implementation of traditional liquid cooled systems has been hampered by the need for a highly invasive plumbing infrastructure. For example, water lines often need to be extended into the electronic equipment itself (e.g., within the server housing), and directly attached to the central processing unit(s) (CPU), graphics processing unit(s) (GPU), or other heat sources. These plumbing requirements also introduce the risk of water damage during connecting/disconnecting the electronics equipment. Achieving density goals for rack systems while meeting device temperature requirements and electrical design rules can be difficult. Existing systems with plumbing in the server may also impact upgrades and service events due to the extensive amount of interconnection between the devices. For example, the tubes are typically designed for series flow, and often the entire tube network needs to be removed.

Heat dissipating systems and methods disclosed herein provide direct cooling options for servers and other equipment. An example device includes a dry disconnect interface, which provides a cooling "socket" along a side of the equipment tray. During operation, heat may be transported from the heat generating device, across the dry disconnect interface, and "dumped" into a thermal bus bar for removal by liquid or other transport mechanism.

The server tray design may combine air convection, solid conduction, thermo-siphon/heat-pipe phase change thermal transport, pumped liquid loop heat transfer, or other cooling approaches. The combination and design of these elements may be optimized for individual equipment tray configurations, without affecting rack level cooling design. The dry disconnect interface provides a point of separation between the server and the rack, without introducing the risk of water damage during connecting/disconnecting the electronics equipment in the rack system.

It is noted that the server design is independent of the rack design. Each may be optimized for a specific application, as long as the common interface (the dry disconnect) removes the heat generated by the server equipment.

The heat dissipating system provides improved cooling when compared to conventional air cooled, liquid cooled, or air conditioning systems. The heat dissipating system provides better cooling of multiple devices in series, without heat shadowing. It is noted that the coolant may be directed to the devices in parallel, even if there are multiple devices from front to rear of the rack. The dry disconnect interface eliminates concerns with liquid cooling techniques by eliminating plumbing inside the server equipment, and costly "dripless quick disconnects" are not needed to meet electrical design guidelines. And, the heat dissipating system can be implemented with less support infrastructure (e.g., air conditioning) for managing heated air. In addition, the heat that is removed can be readily reused for other applications and therefore is not "wasted."

The heat dissipating system may also have a smaller footprint than traditional air cooled systems. The smaller size enables more efficient system design and layout. For example, motherboard components can be more densely packed in a server tray, more components can be provided on each board, smaller boards can be used, and/or the boards themselves can be more densely spaced. Electrical signal routing constraints can also be reduced or altogether eliminated. For example, components can be oriented in a manner which blocks air flowing through the system, if that is advantageous for electrical layout.

It is noted that the heat dissipating systems and methods described herein are not limited to use with any particular type of device or in any particular environment.

Before continuing, the terms "includes" and "including" are defined to mean, but are not limited to, "includes" or "including" and "includes at least" or "including at least." The term "based on" is defined to mean "based on" and "based at least in part on."

FIG. 1a is a high level block diagram of an example heat dissipating system 10. The heat dissipating system 10 includes a heat source 12, such as a processing unit (CPU or GPU) or other heat generating component(s). Large quantities of heat may be generated by the heat source 12, which should be quickly dissipated in order to help ensure continued and efficient operation of electronic components in the rack system.

In an example, heat source 12 may be connected to a heat sink 14. The heat sink 14 may include any suitable structure. For example, the heat sink 14 may be a metal structure and may include a plurality of fins, which are spread apart and face away from the heat source 12 so that heat can be transferred away from the heat source 12. The heat sink may be manufactured as aluminum conduction plates. The aluminum conduction plates may have a thermal conductivity of about 200 W/mK and offer a low resistance. The aluminum conduction plates may also be relatively thin (e.g., about 4 mm thick). Use of this material enables efficient heat removal (e.g., providing a heat flux of about 30 W/cm$^2$) in relatively flat configurations. Other configurations of the heat sink 14 are also contemplated. For example, the heat sink may not have any fins at all, and the heat may be moved by heat pipe into the heat exchanger without heating the surrounding air.

The heat sink 14 is connected to a heat transport device 16, such as a heat pipe. In another example, the heat source 12 may be connected directly to the heat transport device 16, without using a heat sink 14. In either case, the heat transport device 16 moves heat from the electronic component to a primary heat exchanger 18. The primary heat exchanger 18 may be connected via a dry disconnect interface 20 to a secondary heat exchanger 22, such as the thermal bus bar described in more detail below.

The secondary heat exchanger may be liquid cooled and deliver heat outside of the rack system and/or to another suitable location for dissipating heat to the surrounding environment and/or for reuse in downstream heat harvesting applications (e.g., heating buildings). For example, the secondary heat exchanger may be implemented as a closed loop system with air cooled radiator 24 and pump 26 for recirculating the cooling fluid through the secondary heat exchanger 22. The process is substantially continuous and cyclical during operation.

It is noted that the diagram shown in FIG. 1a can be translated to a facility-wide level. For example, this may be accomplished using a scaled up version of what is shown in the diagram. In any event, cool water from the facility enters the secondary heat exchanger, is heated, and is returned to the facility, thus removing heat from the rack.

FIG. 1b is a high level block diagram illustrating operation of another example heat dissipating system 10'. The heat dissipating system 10' includes a heat source 12', such as a processing unit or other heat generating component. The heat source may be connected via a heat sink 14' to a thermal transport 16', such as fluid circulation system. The fluid circulation system uses a fluid to transport heat outside of the electronic component to a primary heat exchanger 18. The primary heat exchanger 18' may be connected via a dry disconnect interface 20' to a secondary heat exchanger 22', such as the thermal bus bar described in more detail below.

The secondary heat exchanger 22' may also be fluid cooled, and delivers heat outside of the rack system and/or to another suitable location for dissipating heat. For example, the secondary heat exchanger 22' may be a closed loop system with radiator 24' and pump 26' for circulating the cooling fluid.

Any suitable fluid may be used in the fluid cooling systems (e.g., thermal transport 16' and/or secondary heat exchanger 22'). In an example, the fluid is water or a fluid mixture. In another example, the fluid may be a liquid which can rapidly undergo phase change from a liquid to a vapor and back to a liquid again. The fluid undergoes phase changes to absorb, transport, and release heat. Examples of such fluids include, but are not limited to, helium, nitrogen, ammonia, acetone, methanol, ethanol, water, and toluene, to name only a few examples. The specific fluid may be selected based on design considerations, such as but not limited to system pressure, system operating temperature, and thermal conductivity.

It is noted that while fluid cooling is implemented in the heat dissipating system 10', both inside the electronic component and at the rack infrastructure (e.g., in the thermal bus bar), no fluid is exchanged at the dry disconnect interface 20' between the thermal bus bar and the electronic component.

The architecture described above with reference to FIGS. 1a and 1b provides a modular and flexible solution to rack mounting, power, and cooling operations. In addition, the heat dissipating system may be scaled to accommodate various operating environments.

Before continuing, it is noted that the heat dissipating system, the components of the heat dissipating system, and the configuration is provided for purposes of illustration. These examples are not intended to be limiting. Other devices, components, and configurations are also contemplated. While the heat dissipating system is described herein as it may be used in a rack environment for computer systems, such as a data center, the heat dissipating system is not limited to use in any particular operating environment.

FIG. 2 is a perspective view of an example heat dissipating system 100 as it may be implemented on a rack server 110. The rack server 110 is shown as a 2 U height rack server 110. The term "U" is short for "unit" and is a computer industry term, typically defined as 1.75 inches. For purposes of illustration, heat-generating components internal to the rack server 110 may include a two socket processor board and six GPU cards. Of course, the heat dissipating system 100 can be implemented with any size and type of rack device (processing device, communications device, storage device).

FIG. 2a is a close up view of a primary heat exchanger 118 on the rack server 110 shown in FIG. 2. The primary heat exchanger 118 is shown between rails 119. Rails 119 provide a channel to guide and support the rack server 110 when installed on the rack system (by sliding into the page) to make an electrical connection. The channels also provide a surface for a clamping system. The clamping system is described in more detail below with reference to FIGS. 4 and 5a-d. An example clamping system includes spring loaded clamps which grasp the brackets 119 and pull the rack server 110 against the thermal bus bar to make a thermal connection. The clamping system may also aid in pushing the rack server 110 from away the wall of the rack system for removal.

The components (e.g., processors, memory and GPU) are provided inside a housing 113 (e.g., a sheet metal enclosure) of the rack server 110. Heat transport 116 may be attached as desired to internal components of the rack server 110 when installed on the rack system (by sliding into the page). The attachment makes a blind mate signal and power connection at the back of server 100 (not shown) into a common backplane interconnect system. The heat transport moves heat to a primary heat exchanger 118 (e.g., metal such as aluminum and/or copper blocks) on a side of the sheet metal enclosure 113.

Figure 3:
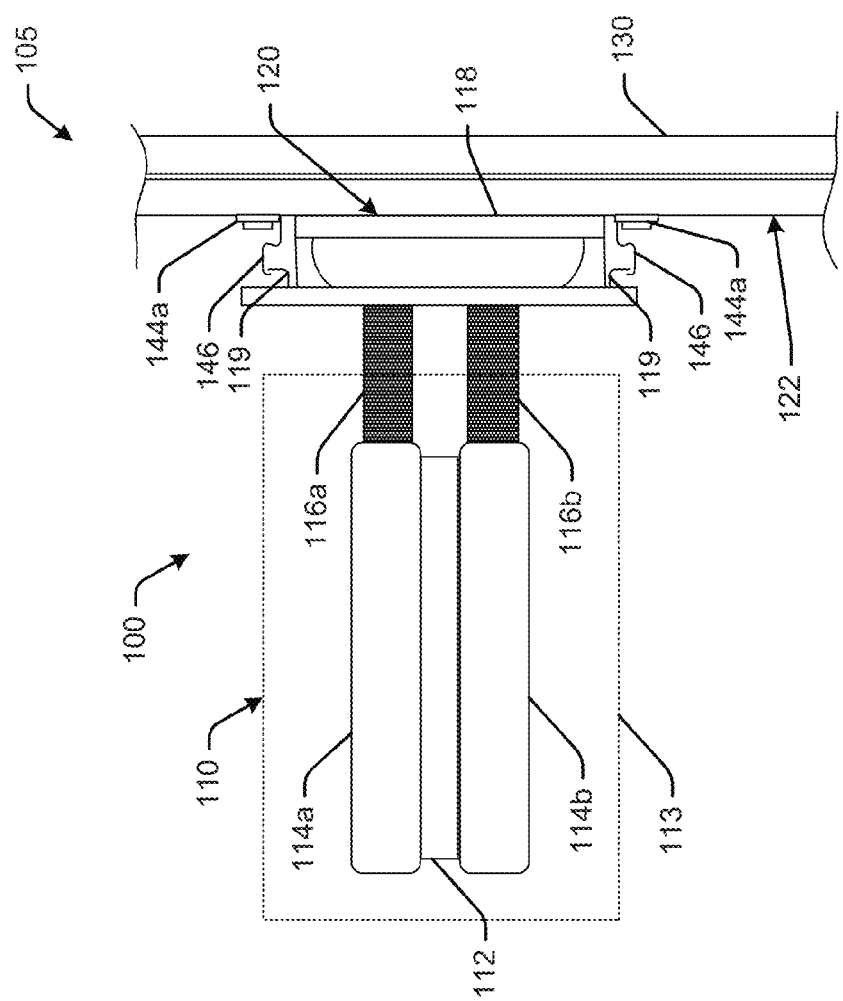
FIG. 3 is a close-up view of the rack server in FIG. 2 shown connected to a secondary heat exchange (a thermal bus bar) on a rack system via a dry disconnect interface.

FIG. 3 is a close-up view of the rack server 110 in FIG. 2 shown connected to a secondary heat exchanger (a thermal bus bar 122) on a rack system 105 via a dry disconnect interface 120. The heat dissipating system 100 may include several sections to facilitate assembly inside the rack server 110. In an example, the heat dissipating system 100 includes a top assembly with a heat sink 114a and heat transport 116a.

A bottom section has similar construction, including a heat sink 114b and heat transport 116b. The heat sinks 114a and 114b are shown "sandwiching" the heat generating component (e.g., a GPU). As such, the heat sinks 114a and 114b pick up heat from both sides of the GPU during operation.

For purposes of illustration, the two piece configuration shown in FIG. 3 114a-b is a combination of plates that attach to the PCA and a section of material that connects to the thermal bus bar outside the server volume. Inside the server, heat sinks 114a-b include two pieces that are about 80 mm×80 mm×10 mm. Heat pipes 116a-b transport the heat to another block of conductive material 118 that is about 25 mm×9 mm×150 mm. So for purposes of comparison, the previous versions (e.g., a 225 W GPU using a strictly air cooled design) has a volume of about 5000 cm$^3$, while the heat pipe and dry disconnect water transport design disclosed herein has a volume of about 1800 cm$^3$ (taking into account both 114a-b and the large block 118). In addition, the new design can support higher power levels, e.g., about 300 W. Accordingly, the air cooled design is about 0.05 W/cm$^3$ compared to 0.17 W/cm$^3$, or greater than three times the density in this illustration.

It is noted that the heat sinks 114a and 114b and heat transports 116a and 116b may be pre-attached to GPU, and then the entire assembly 112 can be connected in a server tray. The primary heat exchange 118 is provided on a side of the sheet metal enclosure, and is exposed along the exterior of one side of the rack server 110.

The dry disconnect interface 120 is formed between primary heat exchange 118 and secondary heat exchange or thermal bus bar 122. The housing 113 of rack server 110 is shown in dashed lines so that heat transport 116 (e.g., heat pipes) is visible as the heat transport may extend from the GPU inside the housing 113. The heat transport 116 extends external from the housing 113 and is connected to the primary heat exchange 118. The thermal bus bar 122 may be mounted to a vertical wall 130 (e.g., to conventional support brackets, not shown) of the rack system 105.

The primary heat exchange 118 and a heat block portion of the thermal bus bar 122 connecting to the primary heat exchange 118 may be manufactured of thermal materials which improve thermal conductivity. Accordingly, the primary heat exchange 118 thermally engages with the thermal bus bar 122 to transfer heat from the heat transport 116 to a cooling fluid in the thermal bus bar 122. The cooling fluid transports heat away from the rack server 110 (e.g., out of the rack system 105).

The rack server 110 may be installed into the rack system 105 with blind mate power and signal connectors positioned at the back, similar to a conventional blade server system. After installing in the rack system 105, the rack server 110 may be connected via the dry disconnect interface 120 to the thermal bus bar 122.

The rack server 110 may be constrained and have proper clearance such that the dry disconnect interface 122 does not make contact with the fluid manifold in the thermal bus bar 122, even during typical "front to back" motion during installation. When no further front to back motion is needed, and the server tray makes a proper electrical connection at the back, the entire server tray can then be translated "sideways". The sideways motion completes a thermal circuit by joining the primary heat exchange 118 to the thermal bus bar 122.

After the rack server 110 is installed in the rack system 105, a clamping mechanism maintains the primary heat exchange 118 in thermal contact with the thermal bus bar 122. The clamping mechanism may be any suitable connection system, such as a spring-loaded connector.

Figure 4:
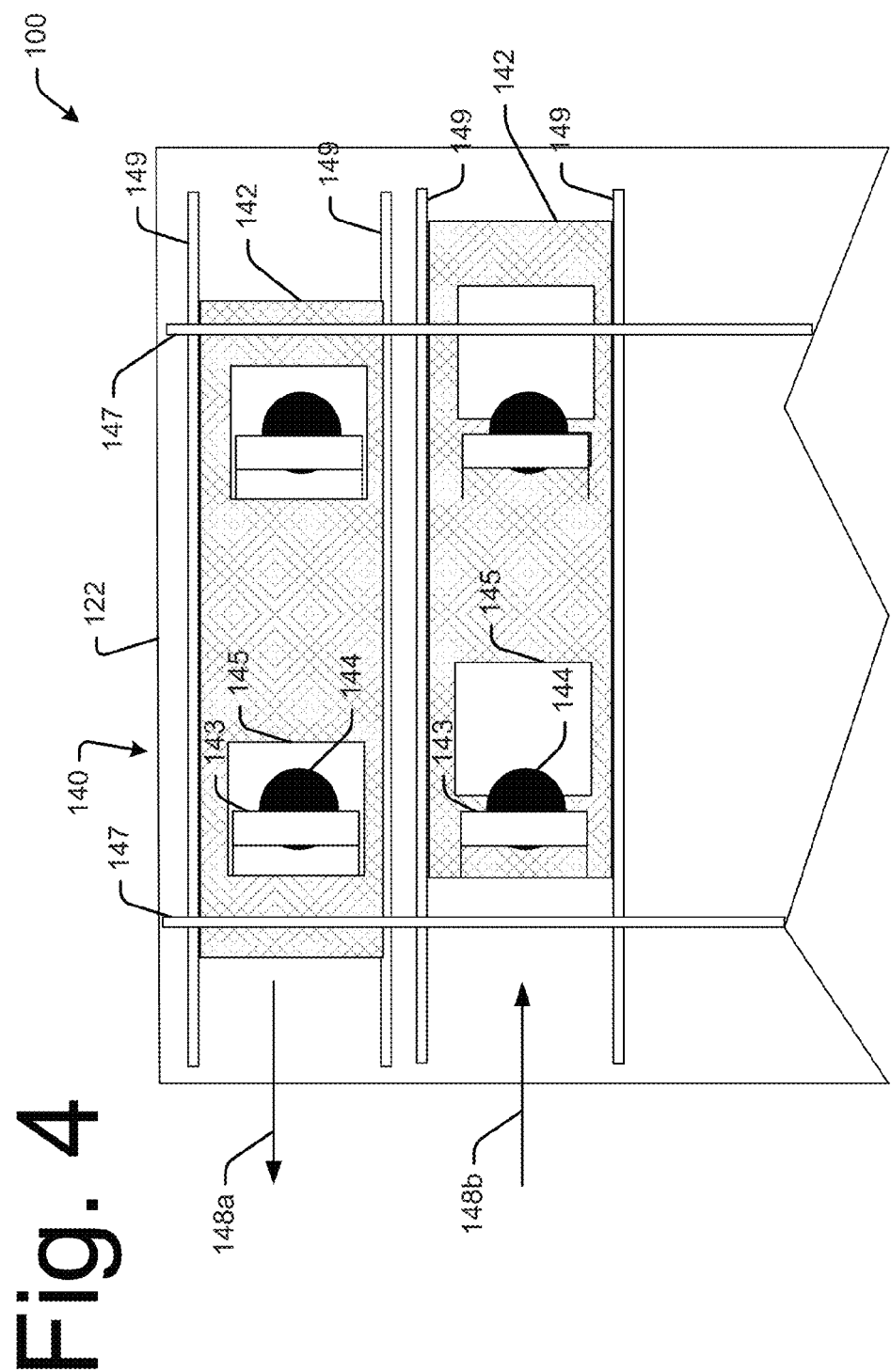
FIG. 4 is a high-level illustration of an example clamp mechanism to connect the rack server to the thermal bus bar.
Figure 5D:
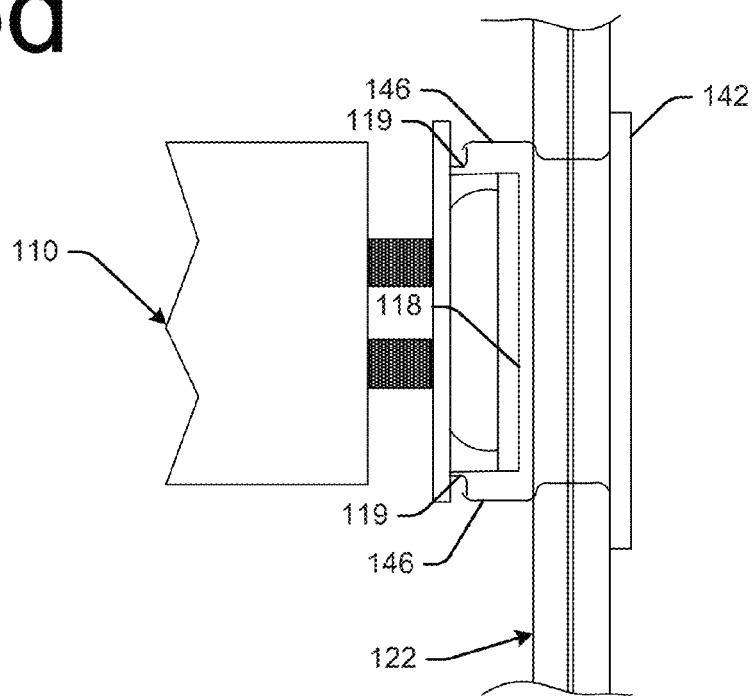
FIG. 5d is a side view showing the rack server being connected to the thermal bus bar where the clamp mechanism is in an unlocked state.
Figure 5E:
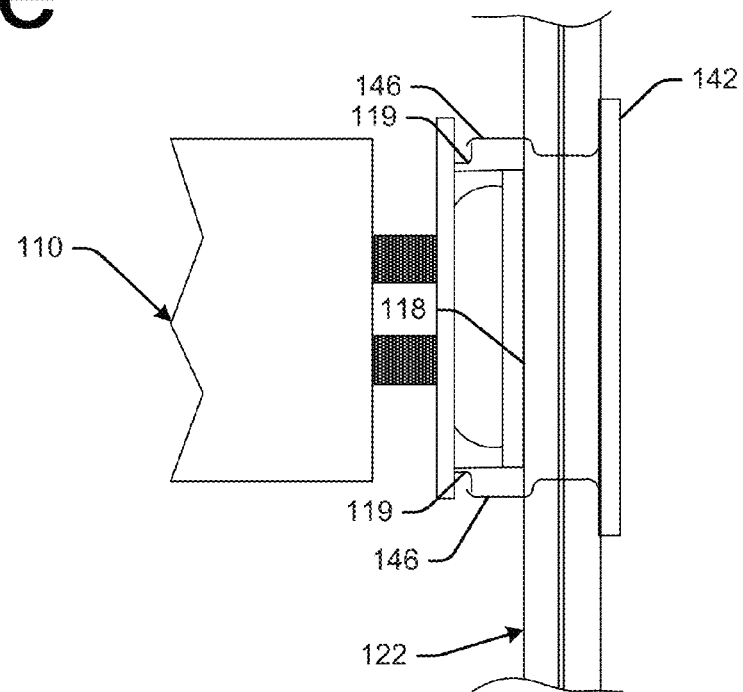
FIG. 5e is a side view showing the rack server being connected to the thermal bus bar where the clamp mechanism is in a locked state.

FIG. 4 is an illustration of an example clamp mechanism 140 to connect the rack server 110 to the thermal bus bar 122. FIG. 5a is a detailed cutaway view of the thermal bus bar showing the clamp mechanism 140 in a locked state. FIG. 5b is a detailed cutaway view of the thermal bus bar 122 showing the clamp mechanism 140 in an unlocked state. FIG. 5c is a cutaway view of an example clamp mechanism 140. FIG. 5d is a side view showing the rack server 110 being connected to the thermal bus bar 122 where the clamp mechanism 140 is in an unlocked state. FIG. 5e is a side view showing the rack server 110 being connected to the thermal bus bar 122 where the clamp mechanism 140 is in a locked state. In the locked state, the clamping mechanism exerts sufficient pressure on the connection to provide a good thermal interface.

The example clamp mechanism 140 is shown including a sliding bar 142 to slide in rails 149 held by slots (e.g., slot 151 in FIG. 4 and FIGS. 5c-d) formed in brackets 147. Pivoting ramps 143 are provided over posts 144 mounted on a cross bar (not shown). The clamp mechanism 140 can move between a locked state (see FIG. 5a) and an unlocked state (see FIG. 5b), according to the following installation procedure. In an example, the clamp mechanism 140 may be in an unlocked state by default, to enable easy installation.

The clamp mechanism 140 is shown in a locked state (FIG. 5a). The sliding bar 142 can be moved in a first direction 148a so that the window 145 closes over the ramp 143. The ramps 143 pivot against respective surfaces 146a (FIG. 5c), compressing respective springs 144a. When the springs 144a are compressed a clamp or bracket 146 extending through to the opposite side of the thermal bus bar 122 moves in an outward direction (see FIGS. 5e-f). In an example, the surface 146a and associated clamps 146 are spring biased, and this movement is against the force of the spring 144a. Thus, the clamps 146 are loosened in the unlocked state so that the rack server 110 can be assembled on the rack system 105, as shown in FIG. 5d.

After installing the rack server 110 by sliding the rack server 110 horizontally into the brackets 146, the sliding bar 142 can be moved in the opposite direction shown by arrow 148b and back to the locked state (see FIG. 5a). This movement causes the window 145 to open over the ramp 143, and the ramp 143 decouples from surfaces 146a. The clamps 146 are automatically returned under the bias of springs 144a to a locked state (see FIG. 5b). In the locked state, the springs 144a retract from the opposite side of the thermal bus bar 122, thus pulling the clamps 146 back toward the thermal bus bar 122. In this locked state, the brackets 146 exert a horizontal force on the primary heat exchange 118, pulling the rack server 110 toward the thermal bus bar 122 and forming the desired thermal interface between the primary heat exchange 118 and the thermal bus bar (see FIG. 5e).

According to the above described example, the design of the clamp results in a push and pull design to accomplish installation. That is, the forward/backward movement makes a signal and power connection between the rack component and the rack system, and a side-to-side movement makes a thermal connection and complete a thermal circuit between the thermal transport in the electronic component and a rack level cooling infrastructure.

This side to side movement and general use of the side of the rack component provides an extensive surface area to connect multiple devices, as opposed to the rear of the server which has a limited surface area. This also allows heat pipe solutions to be provided directly in the server, because the transport is small (e.g., under 250 mm), and enables expansion because dry connections can be readily configured and/or added to the system to meet a customer's changing needs.

It is noted that this interface is a dry disconnect, that is, no fluid is exchanged between the thermal bus bar 122 and the primary heat exchange 118. Other clamping mechanisms may also be used to provide a good thermal interface.

Figure 6A:
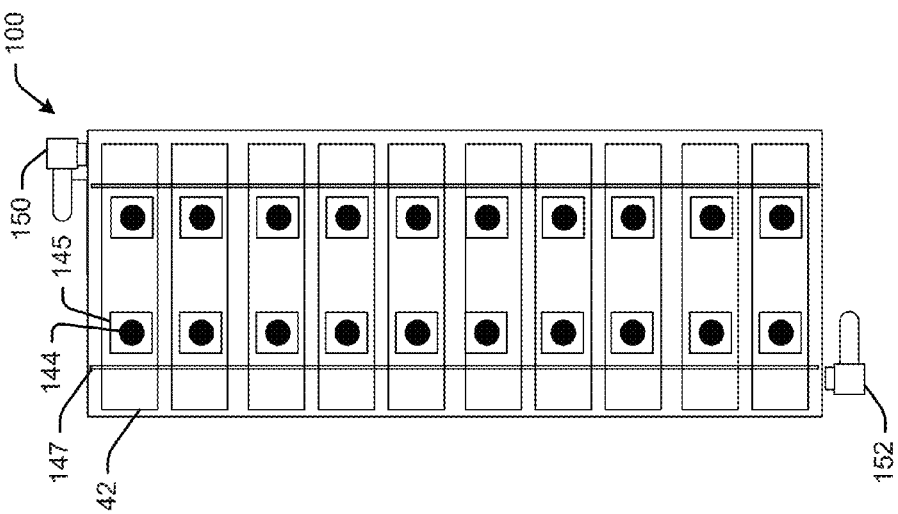
FIGS. 6a-b show a vertical wall of a rack system showing an example of a plurality of installed thermal bus bars, wherein (a) is a front side view of the wall, and (b) is a rear side view of the wall.
Figure 6B:
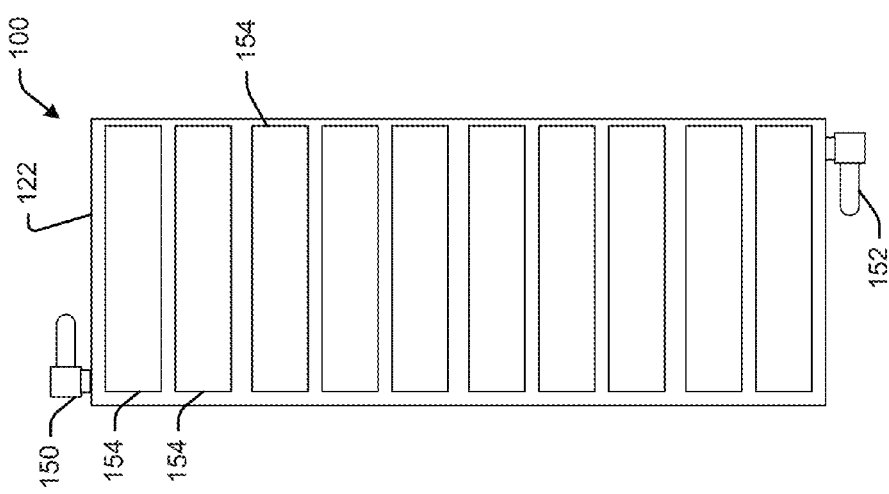

FIGS. 6a-b show an example vertical wall of a rack system 105 showing an example of a plurality of installed thermal bus bars 122, wherein (a) is a front side view of the wall, and (b) is a rear side view of the wall. During operation, heat moves out of the server tray and to the thermal bus bar 122. Each thermal bus bar 122 includes a fluid cooled surface 154. The thermal bus bar 122 can be optimized for manufacturing. In an example, the thermal bus bar 122 includes a frame having two main shell halves which form all fluid flow passages therebetween. The shells may be molded plastic shells assembled using a Very High Bond (VHB) adhesive.

As shown in FIGS. 6a and 6b, thermal bus bar 122 may include a plurality of cooling surfaces 154 mounted on a single vertical wall of the rack system 110. The cooling surfaces 154 may be interconnected such that only a single pair of fluid line connections (fluid in 150 and fluid out 152) need to be provided for the thermal bus bar 122. As such, a thermal bus bar can provide cooling for multiple rack servers 110 (or other electronic components) using a single pair of fluid line connections. It can be seen how such a configuration reduces the plumbing infrastructure needed to implement the heat dissipating system 100.

FIG. 7 is a partial view of one of the thermal bus bars 122 shown in FIG. 6. FIG. 7a is a partial perspective view of the thermal bus bar 122 in FIG. 7 showing an example pin fin array 156. The pin fin array 156 is on the opposite side of the cooling surface 154. In an example, coolant may be evenly distributed inside the thermal bus bar 32 through manifolds built into the structure. The coolant is passed over the pin fin array 156 within the thermal bus bar 122. It is noted that even though the thermal bus bar 122 is fluid cooled, no fluid is exchanged at the dry disconnect interface.

The pin fin array 156 may be made of thermally conductive polymers, aluminum or copper (or other metals or composites). The pin fin array 156 may be installed using a compliant VHB laminate, which also provides leveling for the dry disconnect mating surfaces. The perimeter of the pin fin array 156 may have a compliant adhesive to create a fluid barrier. Screws may be used in screw holes for retention assurance.

Each passage in the pin fin array 156 may include a pair of thermally actuated valves 158, as seen in FIGS. 5a-b. Cool fluid starts in chamber 157, and enters the pin fin array 156. Warm fluid exits pin fin array 156 at inlet passage 158a. In another example (not shown), there may be two valves at the exit.

The valves passively regulate the temperature of the outlet water. In an example, the valves may be active valves. For example, active valves may be actuated by a signal, such as an electrical signal, that triggers movement of the valves. In another example, the valves are passive valves, actuated by the thermal expansion of a wax material within a piston, and therefore do not need an electrical connection to operate.

When the coolant temperature is low, the valve 158 is closed (shown fully closed in FIG. 5a) and restricts flow through the pin fin array 156. As the coolant temperature increases, the valve 158 opens (shown fully open in FIG. 5b)

and allows additional cooling. The open valve 158 fills the exit path, and when water reaches the desired temperature, the valve 158 extends to let more fluid through. Such an implementation maintains a high coolant return temperature, without compromising cooling operations. The consistent high return temperature is well suited to energy reuse applications.

The valves (passive or active) may serve a number of purposes. By modulating the flow of fluid through the manifolds (a single manifold forms part of the larger thermal bus bar 122), the volumetric flow rate of the fluid is tailored to the specific thermal needs of the device being cooled. This reduces (and even minimizes) pumping power, system pressure, the potential for leaks, and thus results in several additional benefits. Control at the single manifold level is possible, and allows for individualized device thermal control. For example, "custom thermal control" can be delivered for a 150 W CPU versus a 300 W GPU, all housed in the same server. The valves are also designed to increase (and even maximize) the temperature of the fluid leaving the manifold. By modulating the flow of water in accordance with the thermal load being removed, the temperature of the fluid can be controlled and even maximized.

FIG. 8 is a flowchart illustrating example operations 800 of a heat dissipating method. Operation 810 includes removing heat from a rack component via a thermal transport. Operation 820 includes applying a pressure between the thermal transport and a fluid cooled thermal bus bar on a rack system to form a thermally conductive dry disconnect interface and form a heat path between the thermal transport and the fluid cooled thermal bus bar.

Removing heat from the rack component may be via a heat pipe in the rack component. Removing heat from the rack component may be via a sealed fluid circulation system in the rack component, and no fluid crosses the dry disconnect interface.

Still further operations may include regulating temperature of a cooling fluid in the thermal bus bar using active valves. Operations may also include regulating temperature of a cooling fluid in the thermal bus bar using passive valves actuated by thermal expansion of a wax material within a piston.

Further operations may also include an electrical connection movement to make a signal and power connection between the rack component and the rack system, and a thermal connection movement different than the electrical connection movement to make a thermal connection and complete a thermal circuit between the thermal transport in the electronic component and a rack level cooling infrastructure.

It is noted that the examples shown and described are provided for purposes of illustration and are not intended to be limiting. Still other examples are also contemplated.

The invention claimed is:

1. A heat dissipating system comprising:
a fluid cooled thermal bus bar;
a thermal transport to remove heat from a heat-generating component and move the heat to a heat exchanger;
a connector connected to the thermal bus bar and the heat exchanger, the connector to apply a pressure between the thermal bus bar and the heat exchanger to shorten a distance between the thermal bus bar and the heat exchanger, forming a thermally conductive dry disconnect interface therebetween, wherein the thermal bus bar does not contact the heat exchanger without the pressure; and
an actuator slidably connected to the fluid cooled thermal bus bar to move the connector to apply the pressure.

2. The device of claim 1, the connector comprising a clamp mechanism having an extended position and an unextended position.

3. The device of claim 2, wherein the clamp mechanism exerts the pressure on one of the heat exchanger and the thermal bus bar to form the thermally conductive dry disconnect interface in the unextended position.

4. The device of claim 1, wherein the thermal transport comprises a heat pipe.

5. The device of claim 1, wherein the heat-generating component is housed in an electronic component; and
wherein the thermal transport comprises a sealed fluid circulation system at least partially inside the electronic component to move heat to the thermal bus bar.

6. The device of claim 1, further comprising a pin fin array in the thermal bus bar.

7. The device of claim 6, further comprising valves in the thermal bus bar to modulate fluid flow through a manifold in the thermal bus bar and past the pin fin array, the valves further provided to regulate temperature of outlet fluid from the pin fin array.

8. The device of claim 1, further comprising a heat sink in thermal connection with the heat-generating component, wherein a heat path is formed between the heat sink and the thermal bus bar.

9. The device of claim 1, wherein the heat-generating component is directly connected to the thermal transport.

10. A heat dissipating method comprising:
removing heat from a rack component via a thermal transport;
making a signal and power connection between a rack component and a rack system with an electrical connection movement; and
completing a thermal circuit between the thermal transport and a fluid cooled thermal bus bar with a thermal connection movement that is different than the electrical connection movement, wherein the thermal connection movement comprises applying a pressure at the fluid cooled thermal bus bar on the rack system to form a thermally conductive dry disconnect interface between the thermal transport and the fluid cooled thermal bus bar.

11. The method of claim 10, further comprising regulating temperature of a cooling fluid in the thermal bus bar using active valves.

12. The method of claim 10, further comprising regulating temperature of a cooling fluid in the thermal bus bar using passive valves actuated by thermal expansion of a wax material within a piston.

13. The method of claim 10, wherein removing heat from the rack component is via a heat pipe in the rack component.

14. The method of claim 10, wherein removing heat from the rack component is via a sealed fluid circulation system in the rack component, and no fluid crosses the dry disconnect interface.

15. A heat dissipating system comprising:
a fluid cooled thermal bus bar;
a thermal transport to remove heat from a heat-generating component and move the heat to a heat exchanger;
a connector to apply a pressure on one of the thermal bus bar and the heat exchanger to form a thermally conductive dry disconnect interface therebetween; and
an actuator slidably connected to the fluid cooled thermal bus bar to move the connector to apply the pressure;

wherein the thermal bus bar comprises a pin fin array, a manifold, and valves to modulate fluid flow through the manifold and past the pin fin array, the valves further provided to regulate temperature of outlet fluid from the pin fin array.

16. The system of claim 2, wherein the actuator is to move the clamp mechanism between the extended position and the unextended position; and wherein the pressure is applied in the extended position.

17. The system of claim 1, wherein the connector comprises a spring mechanism to bias the connector.

\* \* \* \* \*